(12) United States Patent
Chance et al.

(10) Patent No.: US 7,271,413 B2
(45) Date of Patent: Sep. 18, 2007

(54) SEMICONDUCTOR CONSTRUCTIONS

(75) Inventors: Randal W. Chance, Boise, ID (US);
Gordon A. Haller, Boise, ID (US);
Sanh D. Tang, Boise, ID (US); Steven D. Cummings, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 138 days.

(21) Appl. No.: 11/274,727

(22) Filed: Nov. 14, 2005

(65) Prior Publication Data

US 2006/0063350 A1    Mar. 23, 2006

Related U.S. Application Data

(62) Division of application No. 10/925,789, filed on Aug. 24, 2004, now Pat. No. 7,122,425.

(51) Int. Cl.
*H01L 27/108* (2006.01)
(52) U.S. Cl. .......................... 257/68; 438/243
(58) Field of Classification Search ................ 257/68, 257/296, 311, E21.577, E21.649, E21.657, 257/E21.658, E21.651; 438/243, 247, 248
See application file for complete search history.

(56) References Cited

U.S. PATENT DOCUMENTS

| | | | |
|---|---|---|---|
| 4,937,641 A | | 6/1990 | Sunami et al. |
| 5,792,687 A | | 8/1998 | Jeng et al. |
| 5,792,690 A | * | 8/1998 | Sung ........................ 438/253 |
| 6,727,137 B2 | | 4/2004 | Brown |

2002/0127796 A1    9/2002    Hofmann et al.

FOREIGN PATENT DOCUMENTS

| | | |
|---|---|---|
| EP | 0 453 998 A1 | 10/1991 |
| EP | 1 003 219 A2 | 5/2000 |
| EP | 1 003 219 A3 | 5/2000 |
| WO | WO97/44826 | 11/1997 |
| WO | WO 02/089182 A2 | 11/2002 |
| WO | 2004/034587 | 10/2004 |

OTHER PUBLICATIONS

"Vertical MOS Transistors with 70nm Channel Length", Risch et al., IEEE Transactions on Electron Devices, vol. 43, No. 9, Sep. 1996, pp. 1495-1498.
"Device Structures Architectures Compatible With Conventional Silicon Processes—Vertical Transistor Plumbed for Memeory Logic", Clarke, Peter, Electronic Engineering Times, Feb. 14, 2000, p. 24.
"Bell Labs Opens Gat to Deeper- Submicron CMOS", Lammers, David, Electronic Engineering Times, Dec. 6, 1999, p. 18.
"Silicon Contact Formation and Photoresist Planarization Using Chemical Mechanical Polishing", Keast et al., Lincoln Laboratory, Massachusetts Institute of Technology, Jun. 7-8, 1994, pp. 204-205.

* cited by examiner

*Primary Examiner*—David Vu
(74) *Attorney, Agent, or Firm*—Wells St. John P.S.

(57) ABSTRACT

The invention includes semiconductor constructions containing vertically-extending pillars, and methods for forming such constructions. The vertically-extending pillars can be incorporated into transistor devices, and can contain vertically-extending channel regions of the transistor devices. The transistor devices can be incorporated into integrated circuitry, and in some aspects are incorporated into memory constructions, such as, for example, dynamic random access memory (DRAM) constructions.

10 Claims, 11 Drawing Sheets

_Fig 4_

_Fig 5_

_Fig 6_

SEMICONDUCTOR CONSTRUCTIONS

RELATED PATENT DATA

This patent resulted from a divisional of U.S. patent application Ser. No. 10/925,789, filed Aug. 24, 2004, now U.S. Pat. No. 7,122,425, which is hereby incorporated by reference.

TECHNICAL FIELD

The invention pertains to semiconductor constructions and to methods of forming semiconductor constructions. In particular aspects, the invention pertains to methods of forming transistor devices with vertically-extending channel regions, and to constructions comprising such devices.

BACKGROUND OF THE INVENTION

Transistor devices are utilized in numerous semiconductor assemblies. The transistor devices can be utilized in, for example, memory circuitry, such as, dynamic random access memory (DRAM) constructions and static random access memory (SRAM) constructions.

Continuing goals of semiconductor device processing are to increase the scale of integration, simplify processing and reduce costs. It is desired to create new methods of forming transistor constructions which progress toward one or more of such continuing goals.

Inventive aspects described herein can be particularly useful for forming transistor devices. However, it is to be understand that although the invention is primarily described relative to such application, the invention can also be utilized in other semiconductor fabrication applications, as will be recognized by persons of ordinary skill in the art.

SUMMARY OF THE INVENTION

In one aspect, the invention pertains to methods of forming a semiconductor construction. A semiconductor substrate is provided. The substrate includes a plurality of trenched isolation regions extending within a monocrystalline semiconductor material. The isolation regions are spaced from one another by first regions comprising the monocrystalline semiconductor material. The monocrystalline semiconductor material is patterned into a plurality of pillars within the first regions. In subsequent processing, the pillars can be incorporated into transistor devices. In such applications, the pillars can comprise vertically-extending channel regions of the transistor devices.

In one aspect, the invention includes another method of forming a semiconductor construction. A semiconductor substrate is provided. The substrate comprises rows of trenches extending within a first semiconductor material. The rows are spaced from one another by first regions comprising the first semiconductor material. The trenches are only partially filled with dielectric material, and the dielectric material within the trenches forms spaced rows. A second semiconductor material is formed over the semiconductor substrate. The second semiconductor material extends across the first region between the rows of trenches. The first and second semiconductor materials are patterned into a plurality of pillars. Individual pillars comprise a segment of the second semiconductor material over a segment of the first semiconductor material. The pillars extend along rows, with at least some of the pillar rows being spaced from one another by second regions comprising one or more of the dielectric material rows.

In one aspect, the invention encompasses another method of forming a semiconductor construction. A semiconductor substrate is provided. The substrate includes a plurality of trenches extending within a first semiconductor material. The first semiconductor material has an uppermost surface at a first elevational level. The trenches are spaced from one another by first regions comprising the first semiconductor material. The trenches are filled with a first dielectric material. A level of the first dielectric material is reduced within the trenches to form dielectric material lines. The dielectric material lines have uppermost surfaces at a second elevational level which is below the first elevational level. After the level of the first dielectric material is reduced, a second semiconductor material is formed over the semiconductor substrate. The second semiconductor material extends over the dielectric material lines, and also extends across the first regions. Openings are formed through the second semiconductor material to the dielectric material lines, and filled with a second dielectric material. The first and second semiconductor materials are then patterned into a plurality of pillars within the first regions. Individual pillars comprise a segment of the second semiconductor material over a segment of the first semiconductor material. The pillars have uppermost surfaces at a third elevational level which is above the first elevational level.

BRIEF DESCRIPTION OF THE DRAWINGS

Preferred embodiments of the invention are described below with reference to the following accompanying drawings.

FIGS. 2 and 3 are views along the lines 2-2 and 3-3, respectively, of FIG. 1, FIG. 2 is a view along the line 2-2 of FIG. 3, and FIG. 3 is a view along the line 3-3 of FIG. 2.

FIGS. 5 and 6 are views along the lines 5-5 and 6-6 of FIG. 4, FIG. 5 is a view along the line 5-5 of FIG. 6, and FIG. 6 is a view along the line 6-6 of FIG. 5.

FIGS. 8 and 9 are views along the lines 8-8 and 9-9, respectively, of FIG. 7, FIG. 8 is a view along the line 8-8 of FIG. 9, and FIG. 9 is a view along the line 9-9 of FIG. 8.

FIGS. 11 and 12 are views along the lines 11-11 and 12-12, respectively, FIG. 11 is a view along the line 11-11 of FIG. 12, and FIG. 12 is a view along the line 12-12 of FIG. 11.

FIGS. 14 and 15 are views along the lines 14-14 and 15-15, respectively, of FIG. 13, FIG. 14 is a view along the line 14-14 of FIG. 15, and FIG. 15 is a view along the line 15-15 of FIG. 14.

FIGS. 17 and 18 are views along the lines 17-17 and 18-18 of FIG. 16, respectively, FIG. 17 is a view along the line 17-17 of FIG. 18, and FIG. 18 is a view along the line 18-18 of FIG. 17.

FIGS. 20 and 21 are views along the lines 20-20 and 21-21 of FIG. 19, respectively, FIG. 20 is a view along the line 20-20 of FIG. 21, and FIG. 21 is a view along the line 21-21 of FIG. 20.

FIG. 30 is a high-level block diagram of an electronic system according to an exemplary aspect of the present invention.

FIG. 31 is a simplified block diagram of an exemplary memory device according to an aspect of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention pertains to semiconductor constructions comprising vertically-extending pillars, and to methods of forming such constructions. In particular aspects, the pillars can be incorporated into vertical-surrounding-gate field effect transistors. Such transistors can be incorporated into high density memory arrays, such as, for example, high density DRAM and/or SRAM arrays. An exemplary aspect of the invention is described with reference to FIGS. 1-21.

Figure 1:
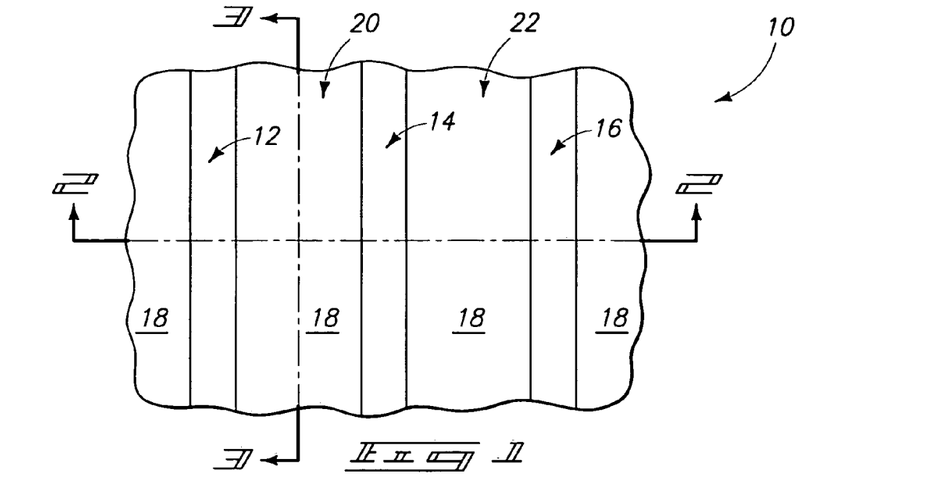
FIGS. 1-3 are a diagrammatic, fragmentary top view (FIG. 1) and cross-sectional side views (FIGS. 2 and 3) of a semiconductor construction at a preliminary processing state of an exemplary aspect of the present invention.
Figure 2:
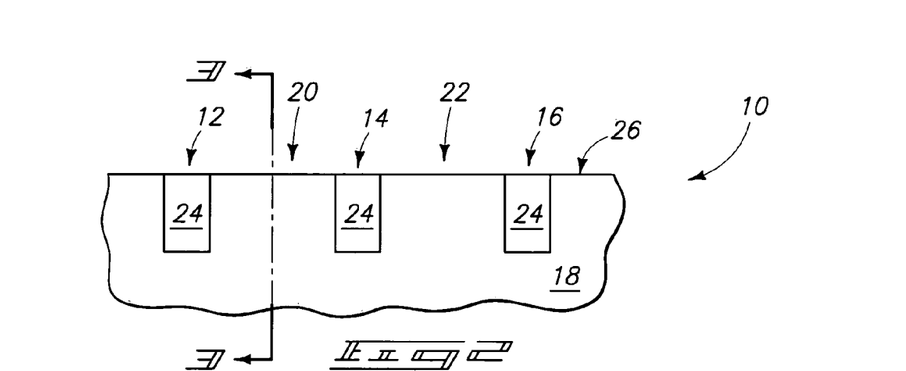
Figure 3:
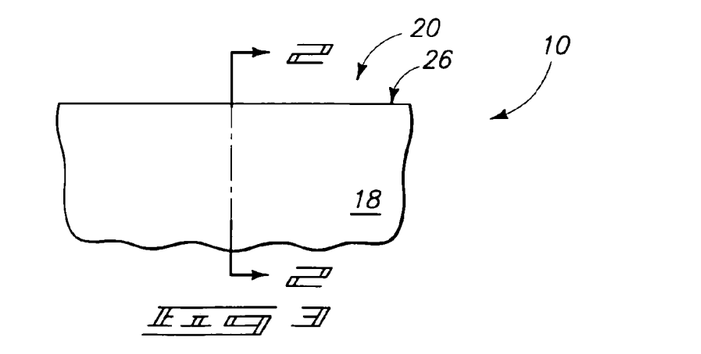

Referring initially to FIGS. 1-3, a semiconductor construction 10 is illustrated at a preliminary processing stage. Construction 10 comprises a semiconductor substrate which includes a plurality of trenched isolation regions 12, 14 and 16 extending within a monocrystalline semiconductor material 18. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Isolation regions 12, 14 and 16 are spaced from one another by regions 20 and 22 of semiconductor material 18. Regions 20 and 22 can be referred to as "first regions" in particular aspects of the present invention.

The isolation regions 12, 14 and 16 comprise trenches formed within semiconductor material 18, and comprise dielectric material 24 provided within the trenches. Dielectric material 24 can be any suitable composition or combination of compositions. In particular aspects, material 24 will comprise, consist essentially of, or consist of silicon dioxide provided over a silicon nitride liner. The trenches formed within monocrystalline material 18 can be formed to any suitable depth, and in some aspects the isolation regions will correspond to so-called shallow trench isolation regions.

Semiconductor material 18 can comprise any suitable semiconductor material, or combination of materials. In particular aspects, material 18 will comprise, consist essentially of, or consist of monocrystalline silicon either alone or lightly-doped with background dopant at the processing stage of FIGS. 1-3. Construction 10 can, in some aspects, correspond to a fragment of a monocrystalline silicon wafer at the shown processing stage of FIGS. 1-3.

Construction 10 has an upper surface 26 at the processing stage of FIGS. 1-3. Such upper surface is shown to be substantially coplanar across dielectric material 24 and across semiconductor material 18, and materials 18 and 24 can be considered to have uppermost surfaces at a common elevational level in the shown aspect of FIGS. 1-3. The elevational level of dielectric material 24 can be referred to as a first elevational level, and the elevational level of semiconductor material 18 can be referred to as a second elevational level. It is to be understood that the invention encompasses other aspects (not shown) in which surface 26 is not coplanar across the dielectric material 24 and semiconductor material 18 (i.e., in which the first and second elevational levels are not the same as one another). In such other aspects, dielectric material 24 can extend above the uppermost surface of material 18 or below such uppermost surface.

Figure 4:
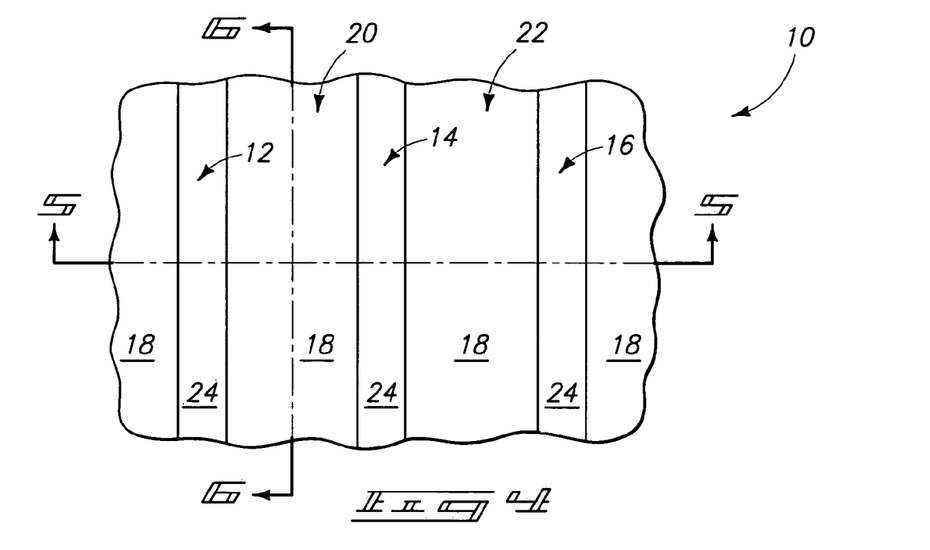
FIGS. 4-6 are views of the fragments of FIGS. 1-3, respectively, shown at a processing stage subsequent to that of FIGS. 1-3.
Figure 5:
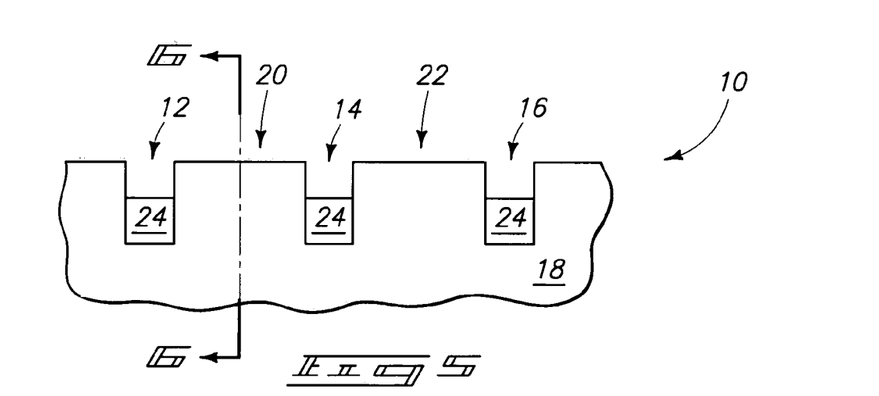
Figure 6:
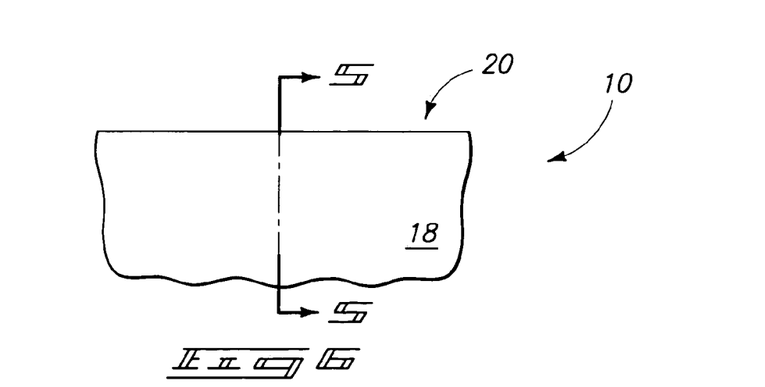

Referring next to FIGS. 4-6, such illustrate construction 10 after dielectric material 24 has been recessed within trenches 12, 14 and 16. In aspects in which dielectric material 24 comprises, consists essentially of, or consists of silicon dioxide, the etch utilized to recess material 24 can be a wet etch. For example, the etch can be a buffered oxide etch, and/or can utilize hydrofluoric acid (in particular aspects the etch will utilize diluted hydrofluoric acid). If semiconductor material 18 consists essentially of monocrystalline silicon and dielectric material 24 consists essentially of silicon dioxide, the etch utilized to recess material 24 is preferably an etch selective for silicon dioxide relative to silicon (i.e., an etch which removes silicon dioxide at a faster rate than silicon, which can include, but is not limited to, an etch which is 100% selective for silicon dioxide relative to silicon). As will become clear in the discussion that follows, the amount by which the dielectric material 24 is recessed determines the height of semiconductor material pillars in some aspects of the invention. In such aspects, the etch can be conducted to recess the dielectric material by from about 500 Å to about 1500 Å, and can, for example, be conducted to recess the dielectric material by from about 1000 Å to about 1500 Å.

As was discussed previously, the trenches 12, 14 and 16 can correspond to conventional trenches utilized for shallow trench isolation regions. It is noted, however, that the trenches can also be formed to be deeper than those traditionally utilized for shallow trench isolation regions in order to compensate for the recessing of dielectric material 24 within the isolation trenches. In some aspects, the trenches can extend to a depth greater than about 2000 Å.

The recessing of dielectric material 24 reduces the elevational height of the dielectric material (the so-called first elevational level referred to above) relative to the elevational height of semiconductor material 18 (the so-called second elevational level referred to above). Thus, the elevational level of the uppermost surface of semiconductor material 18 is above the elevational level of the uppermost surface of dielectric material 24 at the processing stage of FIGS. 4-6. In other words, trenches 12, 14 and 16 are only partially filled with dielectric material 24 at the processing stage of FIGS. 4-6. The dielectric material within the trenches forms spaced rows, as can be seen in the top view of FIG. 4. The up-down direction of the FIG. 4 view can be defined as a longitudinal direction, and the side-to-side direction of the FIG. 4 view can be defined as a horizontal direction. Accordingly, the rows of dielectric material are elongated in the defined longitudinal direction. In particular aspects, the rows can be referred to as longitudinally-extending dielectric lines. Such lines are separated from one another by longitudinally-extending strips of semiconductor material 18 (such as, for example, the strips 20 and 22 of FIGS. 4 and 5).

Figure 7:
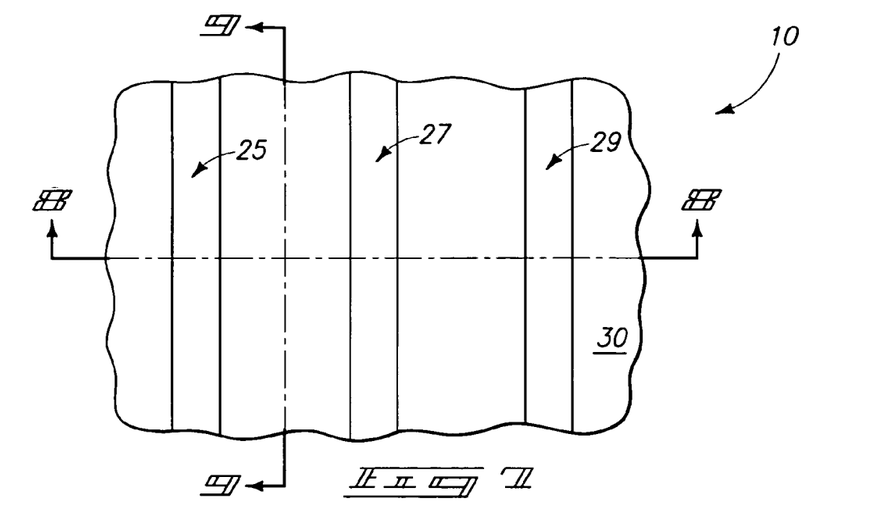
FIGS. 7-9 are views of the fragments of FIGS. 1-3, respectively, shown at a processing stage subsequent to that of FIGS. 4-6.
Figure 8:
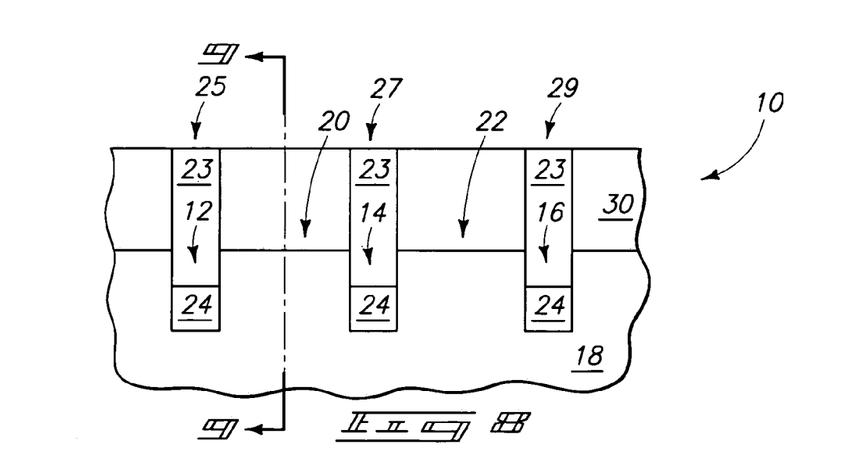
Figure 9:
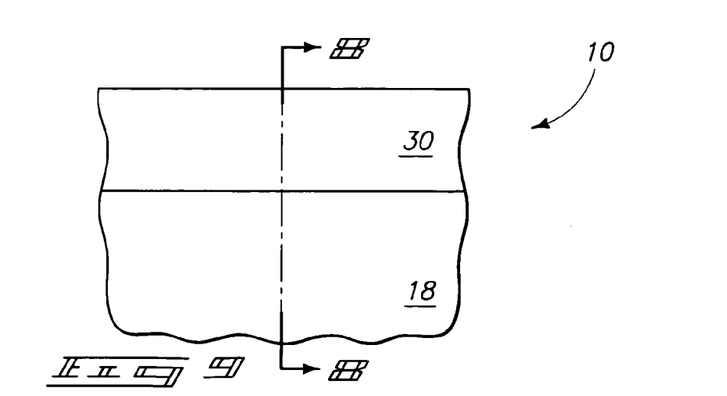

Referring next to FIGS. 7-9, a semiconductor material 30 is formed over material 18, and a dielectric material 23 is formed within the semiconductor material and directly over trenches 12, 14 and 16. The dielectric material 23 is patterned into lines 25, 27 and 29.

The shown construction can be formed by initially providing semiconductor material 30 over substrate 18 and over trenches 12, 14 and 16. Subsequently, openings can be formed through material 18 to the material 24 within trenches 12, 14 and 16, and the openings can be filled with the dielectric material 23. In some aspects, the dielectric material 23 will be formed to overfill the openings in material 30, and subsequently excess material will be removed by planarization to form the shown planarized upper surface extending across material 30 and lines 25, 27 and 29. The dielectric material 24 within the trenches is in rows, and the dielectric material 23 raises an elevational level of the dielectric material rows to the height of material 30.

The dielectric material 23 can be referred to as a second dielectric material to distinguish the material from the first dielectric material 24 that was described previously. Material 23 can comprise any suitable dielectric composition or combination of compositions. In some aspects, material 23 can be compositionally the same as material 24, and in other aspects material 23 can be different than material 24. Dielectric material 23 can, for example, comprise, consist essentially of, or consist of doped or undoped silicon dioxide.

Material 30 can comprise any suitable semiconductor material. In particular aspects, material 30 will comprise, consist essentially of, or consist of silicon. The silicon can be in one or more of amorphous, polycrystalline or single crystalline form. For instance, material 30 can comprise, consist essentially of, or consist of single crystal silicon epitaxially grown from exposed surfaces of monocrystalline material 18. Alternatively, material 30 can comprise, consist essentially of, or consist of polycrystalline and/or amorphous silicon deposited over material 18 by, for example, chemical vapor deposition and/or atomic layer deposition.

Material 30 can be referred to as a second semiconductor material to distinguish the material from the first semiconductor material 18.

Material 30 can be formed to be of any suitable thickness. In particular aspects, material 30 can be formed to a thickness of from about 1000 Å to about 3000 Å, and in some aspects can be formed to a thickness greater than or equal to about 1500 Å.

The semiconductor material 30 can be undoped at the processing stage of FIGS. 7-9. Alternatively, semiconductor material 30 can be formed to be in situ doped. For instance, in particular applications (discussed in more detail below), material 30 is ultimately patterned into vertically-extending pedestals (i.e., pillars) comprising a source/drain region and/or a channel region of a transistor device. In such aspects, material 30 can be formed to be appropriately doped so that the pillars will have the desired doping therein without additional implants. Alternatively, material 30 can be formed so that additional implants are provided within material 30 after the material is patterned into the vertically-extending pillars.

Material 30 can be utilized for numerous functions in various aspects of the invention. For instance, a purpose of material 30 can be to increase a vertical height of pillars ultimately formed between trenches 12, 14 and 16. Such can be advantageous if, for example, increased channeling is desired in transistors comprising the pillars as vertically-extending channel regions.

Figure 10:
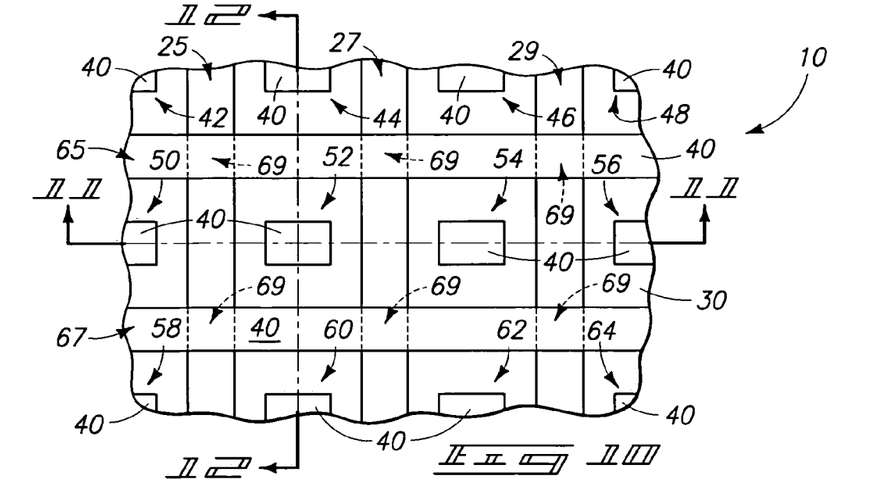
FIGS. 10-12 are views of the fragments of FIGS. 1-3, respectively, shown at a processing stage subsequent to that of FIGS. 7-9.
Figure 11:
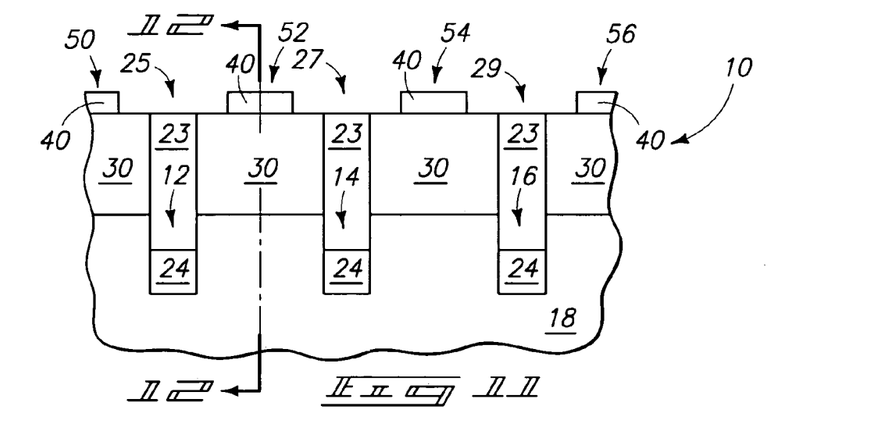
Figure 12:
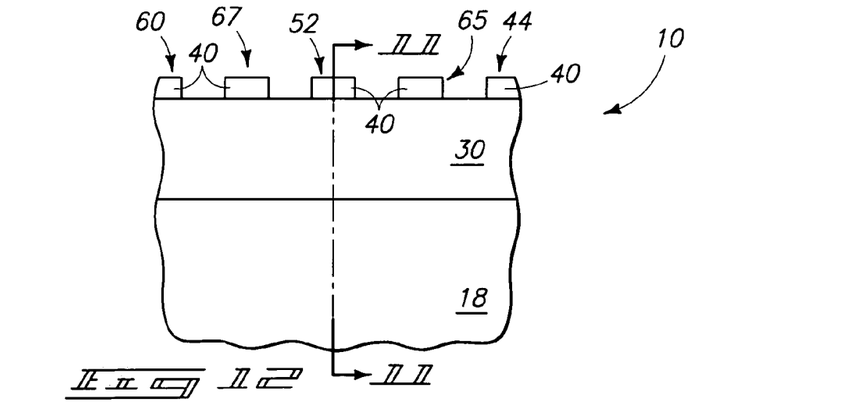

Referring next to FIGS. 10-12, a patterned material 40 is formed over semiconductor material 30 and dielectric lines 25, 27 and 29. Material 40 can correspond to a so-called hard mask (i.e., to a mask formed of material other than photoresist), and in particular aspects will comprise, consist essentially of, or consist of silicon nitride.

Material 40 can be formed into the desired mask pattern utilizing any suitable method. In a particular aspect, material 40 is silicon nitride and is formed into the desired pattern utilizing the following multi-step method. Initially, silicon dioxide is formed over material 30, and openings are formed to extend through the silicon dioxide in locations where nitride mask material 40 is ultimately desired. A silicon nitride layer is then formed over the silicon dioxide and within the openings. The silicon nitride is subjected to a blanket etch which removes the silicon nitride from over the silicon dioxide while leaving the silicon nitride within the openings that had been formed through the silicon dioxide. Such blanket etch can comprise, for example, chemical-mechanical polishing. Subsequently, the silicon dioxide is removed with a wet etch selective for the silicon dioxide relative to silicon nitride. The silicon nitride remaining is in the form of the desired patterned hard mask.

An alternative method for forming the silicon nitride in the desired patterned hard mask is to deposit a layer of silicon nitride over material 30, and to then pattern the silicon nitride using photolithographically processed photoresist (i.e., to form a photolithographically patterned photoresist mask over the silicon nitride, transfer a pattern from the photoresist mask to the silicon nitride with an appropriate etch of the silicon nitride, and then remove the photoresist mask).

The shown patterned mask comprises lines 65 and 67, and spaced islands 42, 44, 46, 48, 50, 52, 54, 56, 58, 60, 62 and 64. The lines 65 and 67 extend substantially orthogonally to a direction of dielectric lines 25, 27 and 29, as can be seen in the top view of FIG. 10. The locations where dielectric lines 25, 27 and 29 are crossed by lines 65 and 67 are diagrammatically shown as locations 69.

The islands 42, 44, 46, 48, 50, 52, 54, 56, 58, 60, 62 and 64 form an array comprising longitudinally-extending columns (such as the column comprised by islands 42, 50 and 58), and horizontally-extending rows (such as the row comprised by islands 50, 52, 54 and 56). Although the longitudinally-extending lines of islands (such as longitudinally-extending line of islands 42, 50 and 58) are described as "columns", and contrasted with the horizontally-extending "rows" of islands, it is to be understood that the term "row" can be utilized outside of the concept of an array to refer to any line in any orientation. Thus, the longitudinally-extending lines can also be considered "rows" in some aspects of the invention. For instance, the aspect of FIGS. 10-12 can be considered to comprise longitudinally-extending rows of islands (such as the longitudinally-extending row of islands 42, 50 and 58), and longitudinally-extending rows 25, 27, and 29 of dielectric material within semiconductor material 30.

Figure 22:
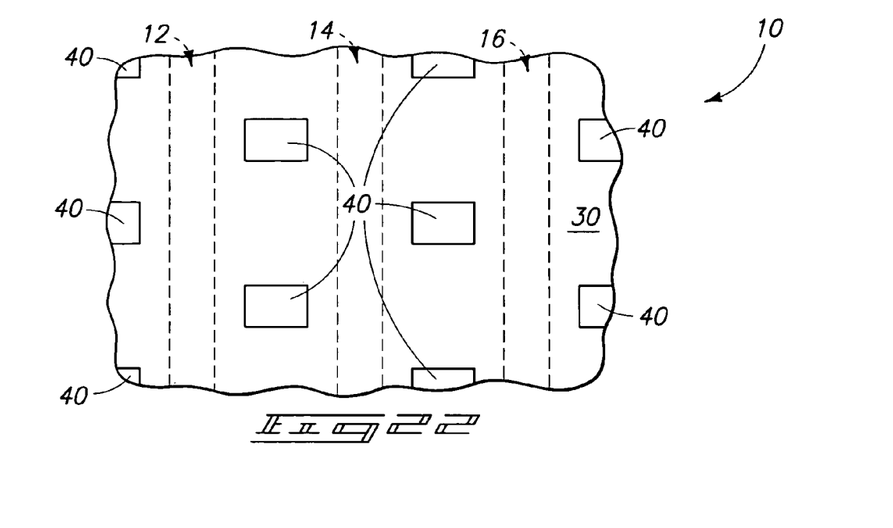
FIG. 22 is a view of the fragment of FIG. 1 shown at the processing stage of FIG. 10, in an alternative embodiment relative to that described previously with reference to FIG. 10.

In the shown aspect of the invention, horizontally adjacent pillars (such as the pillars 50 and 52) are not longitudinally staggered relative to one another. In contrast, FIG. 22 shows construction 10 at the processing stage of FIG. 10, but in accordance with an aspect in which horizontally-adjacent islands of masking material 40 are longitudinally staggered relative to one another. The aspect of FIG. 22 can be preferred relative to that of FIG. 10 in that the aspect of FIG. 22 may allow tighter packing of structures formed utilizing patterned material 40 then can be achieved with the aspect of FIG. 10. For instance, as will be discussed below, masking material 40 can be utilized for forming pillars from one or both of materials 30 and 18. The aspect of FIG. 22 may allow the pillars to be more tightly packed than the aspect of FIG. 10. The dielectric lines 25, 27, 29 are not shown in FIG. 22, nor are the lines 65 and 67, in order to simplify the drawing, but it is to be understood that structures analogous to lines 25, 27, 29, 65 and 67 would typically be included in FIG. 22 aspects of the invention.

Figure 13:
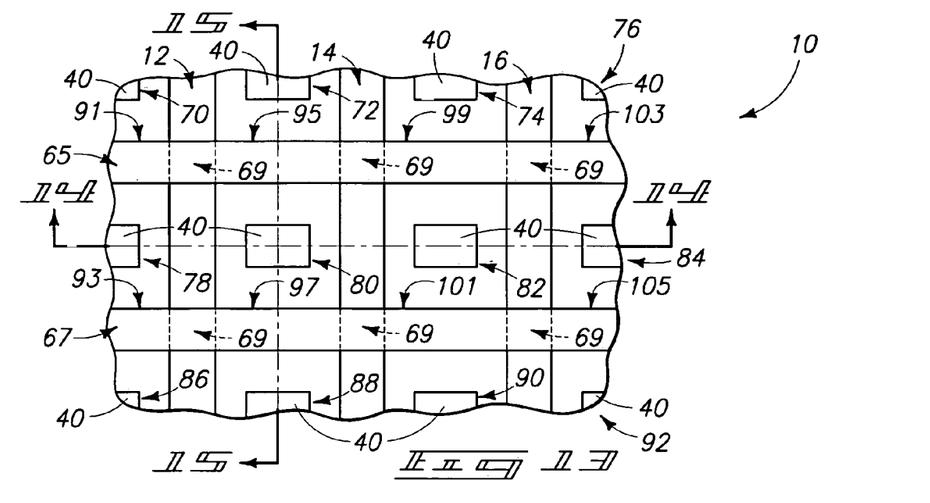
FIGS. 13-15 are views of the fragments of FIGS. 1-3, respectively, shown at a processing stage subsequent to that of FIGS. 10-12.
Figure 14:
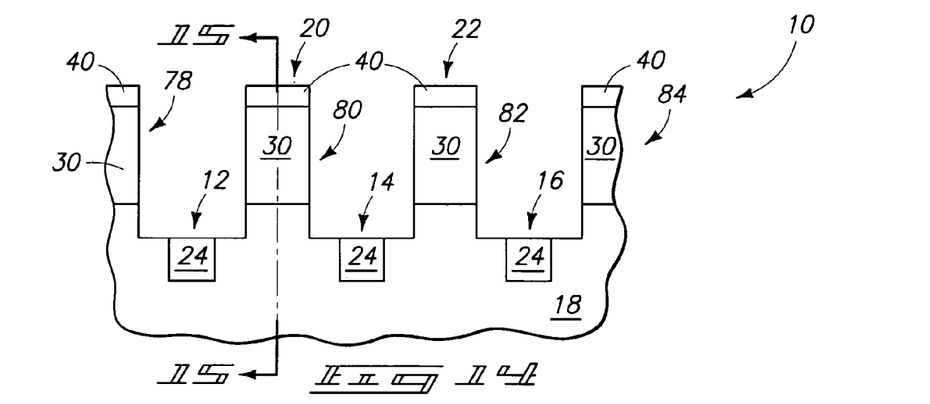
Figure 15:
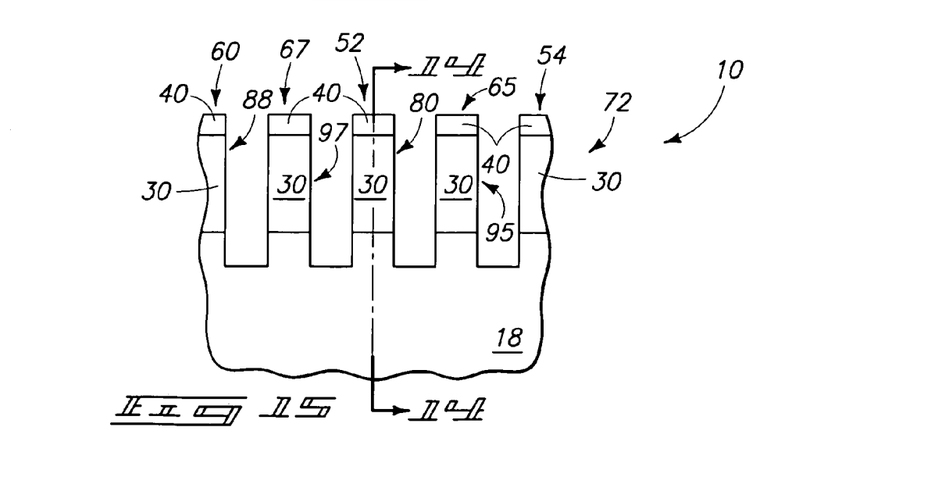

Referring to FIGS. 13-15, a pattern from masking material 40 is transferred into semiconductor materials 18 and 30 to form pillars 70, 72, 74, 76, 78, 80, 82, 84, 86, 88, 90 and 92 within the regions between the trenched isolation regions (such as, for example, the regions 20 and 22).

The transfer of the pattern of mask 40 into the underlying materials forms lines from the materials underlying lines 65 and 67. Thus, regions of dielectric lines 25, 27 and 29 (FIGS. 10-12) that are not protected by the masking material 40 are removed, and the only remaining portions of lines 25, 27 and 29 are at locations 69 wherein the lines 25, 27 and 29 are crossed by lines 65 and 67. The portions of dielectric material from lines 25, 27 and 29 at locations 69 segment the materials beneath lines 65 and 67 into sections 91, 93, 95, 97, 99, 101, 103 and 105 of material 30 which are spaced from one another by the portions 69 of dielectric material remaining from lines 25, 27 and 29.

Any suitable etch can be utilized for transferring the pattern from masking material 40 into the underlying materials, including, for example, a reactive ion etch. The etch preferably extends through semiconductor material 30 and lines 25, 27 and 29, and into semiconductor material 18, as shown. Further, the etch preferably terminates when a level of semiconductor material 18 between the pillars is at about the same elevational level as the uppermost surfaces of dielectric material 24 within regions 12, 14 and 16. Such can be accomplished utilizing, for example, a timed etch and/or an end point determination of one or more components from material 24.

The pillars 70, 72, 74, 76, 78, 80, 82, 84, 86, 88, 90 and 92 have the same array pattern as that discussed previously for the islands of hard masking material 40 in FIGS. 10 and 22. Accordingly, the pillars can be formed so that horizontally adjacent pillars are not longitudinally staggered relative to one another, or can be formed so that horizontally adjacent pillars are longitudinally staggered relative to one another.

It is noted that in the shown embodiment each of the longitudinally-extending rows of pillars is spaced from a horizontally adjacent row of pillars by a single row of dielectric material (for instance, the longitudinally-extending row of pillars 70, 78 and 86 is spaced from the adjacent longitudinally-extending row of pillars 72, 80 and 88 by a gap which includes the single row 12 of dielectric material). It is to be understood, however, that the invention encompasses other aspects (not shown) in which adjacent rows of pillars are spaced from one another by two or more dielectric material rows.

Each of the shown pillars comprises a segment of the second semiconductor material 30 over a segment of the first semiconductor material 18. The pillars can be considered to comprise mesas of the monocrystalline material 18 extending upwardly from longitudinally-extending strips of the material 18 between isolation regions 12, 14 and 16. The mesas define bases of the pillars. In the shown aspect of the invention, the lowest-most portion of the pillar bases is at about the same elevational level as the uppermost portion of the dielectric material 24 within isolation regions 12, 14 and 16. In contrast, each of the pillars has an uppermost portion of semiconductor material defined by the uppermost portion of material 30, with such uppermost portion being above the uppermost elevational level of material 18 at the processing stage of FIG. 5 (i.e., being above the so-called second elevational level of the FIG. 5 construction). Thus, the uppermost semiconductor material 30 of the pillars defines an uppermost elevational level of the pillars that can be referred to as a third elevational level which is above the levels discussed with reference to FIG. 5 for the elevational levels of dielectric material 24 and semiconductor material 18.

Although the shown patterning utilized to form the pillars extends through second semiconductor material 30 and into first semiconductor material 18, it is to be understood that the invention encompasses other aspects (not shown) in which the pillars only extend into second semiconductor material 30, and do not extend to first semiconductor material 18.

Figure 16:
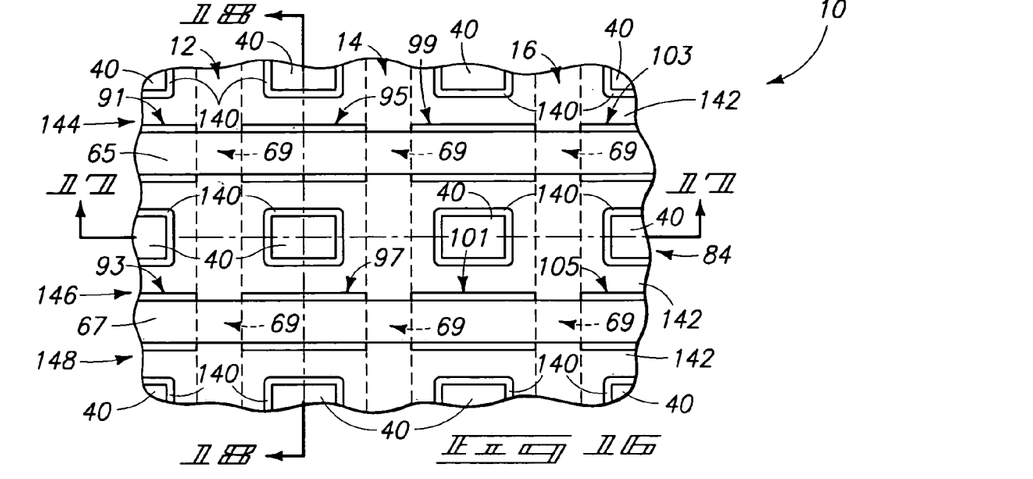
FIGS. 16-18 are views of the fragments of FIGS. 1-3, respectively, shown at a processing stage subsequent to that of FIGS. 13-15.
Figure 17:
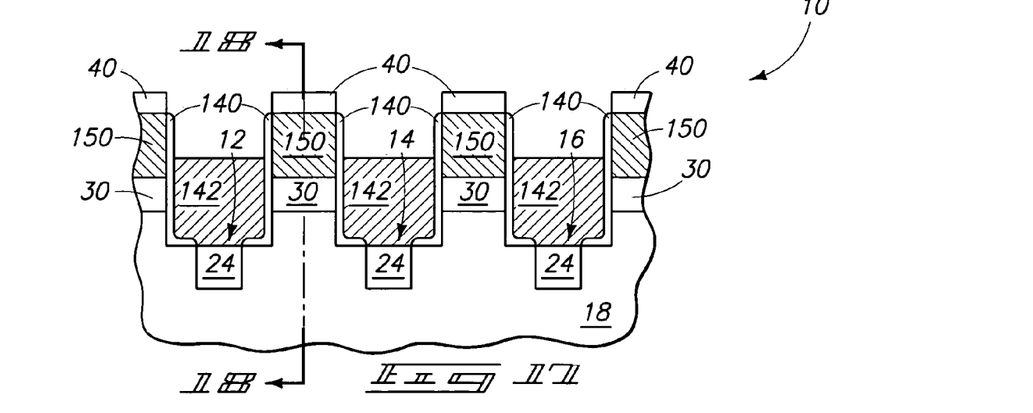
Figure 18:
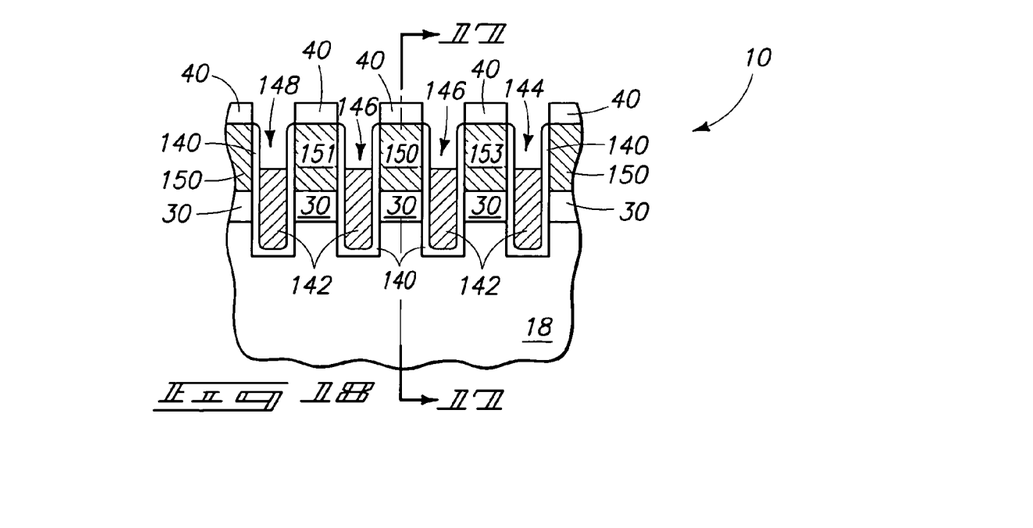

Referring next to FIGS. 16-18, gate dielectric 140 is formed along sidewalls of the pillars 70, 72, 74, 76, 78, 80, 82, 84, 86, 88, 90 and 92; along sidewalls of the sections 91, 93, 95, 97, 99, 101, 103 and 105 of material 30; and also along exposed regions of the semiconductor material 18 between the pillars. The gate dielectric material can comprise, consist essentially of, or consist of, for example, silicon dioxide. The gate dielectric material can be formed by oxidizing exposed surfaces of semiconductor materials 18 and 30, and/or by deposition of desired dielectric materials. The gate dielectric material is not shown being formed along the various dielectric materials of construction 10, but it is to be understood that the invention encompasses other embodiments in which the dielectric material of the gate dielectric is formed along the various dielectric materials of construction 10 as well as along materials 18 and 30.

A gateline material 142 is shown formed around the pillars. The gateline material is in horizontally-extending strips 144, 146 and 148 which are separated from one another by lines 65 and 67. The strips 144, 146 and 148 of the gateline material form wordlines extending along rows of the pillars, and separated from the pillars by the dielectric material 140. The gateline materials can entirely surround the pillars, as shown, or in other aspects (not shown) may only partially surround at least some of the pillars.

The patterned gateline strips 144, 146 and 148 can be formed utilizing any suitable methodology. In particular aspects, the strips will be formed by depositing the gateline material across an entirety of construction 10 and subsequently utilizing planarization (such as, for example, chemical-mechanical polishing) to remove the gateline material from over masking material 40.

Gateline material 142 can comprise any suitable composition, or combination of compositions. In particular aspects, material 142 will comprise, consist essentially of, or consist of conductively-doped silicon. In some aspects, material 142 can comprise metal and/or metal compounds, either alone, or in combination with conductively-doped silicon.

Gateline material 142 can be formed to any suitable thickness, but preferably is formed to a thickness which only partially overlaps the elevational thickness of semiconductor material 30. In exemplary applications, gateline material 142 will have a thickness of at least about 500 Å, and in some applications can have a thickness of greater than 1000 Å.

The cross-sections of FIGS. 17 and 18 show that source/drain regions 150, 151 and 153 have been formed within material 30. The source/drain regions within the pillars are labeled as 150, and can be referred to as first source/drain regions. The source/drain regions within sections 97 and 95 (FIG. 18) are labeled as 151 and 153, respectively, and can be referred to as second source/drain regions to distinguish them from the source/drain regions in the pillars. The source/drain regions can be formed with any suitable implant of conductivity-enhancing dopant, and are formed to elevationally overlap the gateline material 142.

The source/drain regions 150 at the top of the pillars are gatedly connected with the source/drain regions in sections 91, 93, 95, 97, 99, 101, 103 and 105 (such as the source/drain regions 151 and 153 of FIG. 18) through channel regions. Such channel regions extend within the pillars and sections, and also extend within portions of substrate 18 interconnecting the pillars and sections. The channel regions can be doped at any suitable processing stage, and can, for example, be in situ doped during formation of one or both of semiconductor materials 18 and 30. The gateline 142, source/drain regions 150, and source/drain regions within the sections 91, 93, 95, 97, 99, 101, 103 and 105 (for example, the source/drain regions 151 and 153) together form a plurality of field effect transistor constructions.

Figure 19:
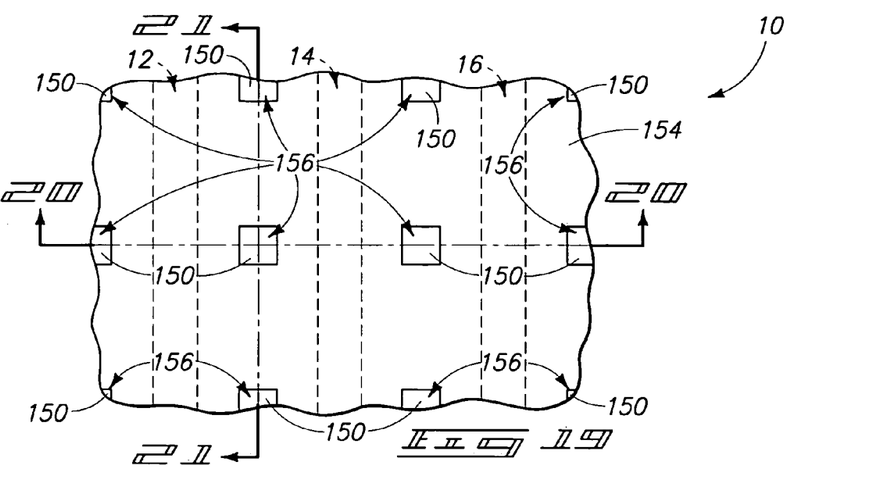
FIGS. 19-21 are views of the fragments of FIGS. 1-3, respectively, shown at a processing stage subsequent to that of FIGS. 16-18.
Figure 20:
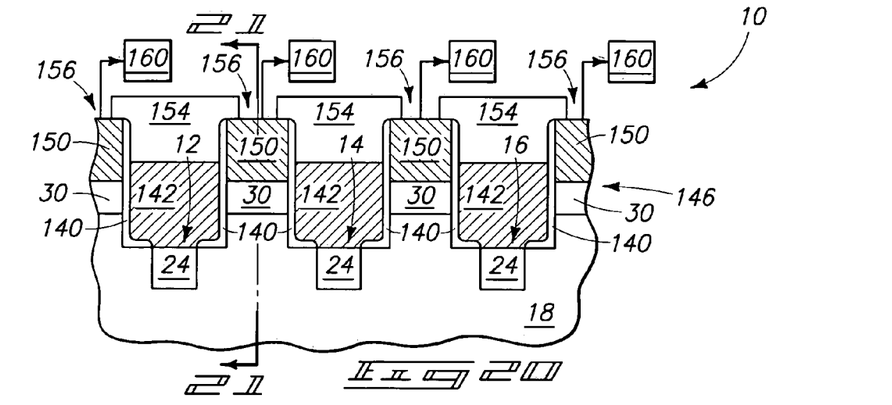
Figure 21:
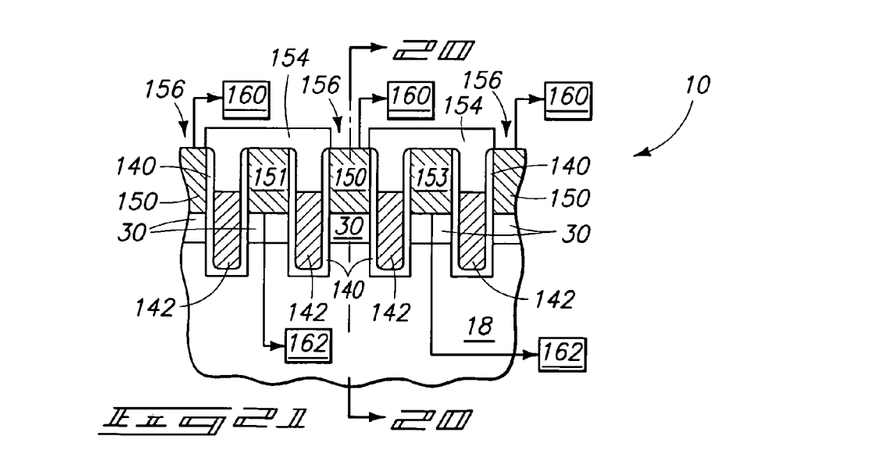

Referring next to FIGS. 19-21, masking material 40 (FIGS. 16-18) is removed and subsequently an insulative material 154 is formed over the upper surface of the construction. Insulative material 154 can comprise any suitable composition or combination of compositions, and in some aspects will comprise, consist essentially of, or consist of one or more of silicon nitride, silicon dioxide, and borophosphosilicate glass (BPSG).

The material 154 has openings 156 extending therethrough to expose source/drain regions 150, and can have other openings (not shown) extending to the source/drain regions in the sections between the pillars (the source/drain regions 151 and 153, for example). The source/drain regions 150 can be electrically connected with capacitor constructions 160 (diagrammatically illustrated by boxes in FIGS. 20 and 21) through interconnects (not shown) extending within the openings 156. Similarly, the source/drain regions within the sections between pillars (the source/drain regions 151 and 153, for example) can be connected to bitlines 162 through appropriate interconnects. The transistor devices comprising channels within the pillars can thus be incorporated into DRAM constructions. The constructions can be formed in numerous levels of integration, and in some aspects can be incorporated into, for example, $4F^2$, $6F^2$, or $8F^2$ DRAM cell arrays. In other aspects of the invention (not shown), the transistor constructions of FIGS. 19-21 can be incorporated into other types of memory devices besides, or in addition to being incorporated in DRAM devices. For instance, the transistor constructions can be incorporated into SRAM devices.

Another aspect of the invention is described with reference to FIGS. 23-25. In referring to such aspect, similar numbering will be used as was used above in describing FIGS. 1-21, where appropriate.

Figure 23:
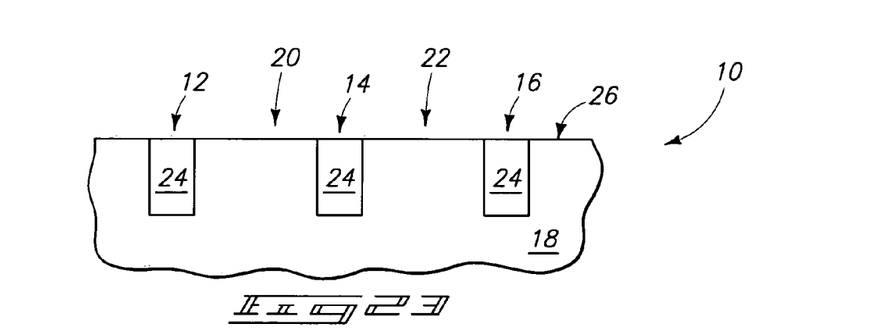
FIG. 23 is a view of the fragment of FIG. 2, and is shown as a preliminary processing stage of another exemplary aspect of the present invention.

Referring initially to FIG. 23, a construction 10 is illustrated at the processing stage of FIG. 3. Construction 10 thus comprises the crystalline semiconductor material 18 described previously, and further comprises the isolation regions 12, 14 and 16 extending within semiconductor material 18. The construction also comprises the regions 20 and 22 extending between the isolation regions, and is shown comprising a planarized upper surface 26 extending across the isolation regions and also across an uppermost surface of semiconductor material 18. It is noted that upper surface 26 can be non-planer in other aspects of the invention (not shown), and specifically that the surfaces of regions 12, 14 and 16 can be above the surface of material 18 in such other aspects.

Figure 24:
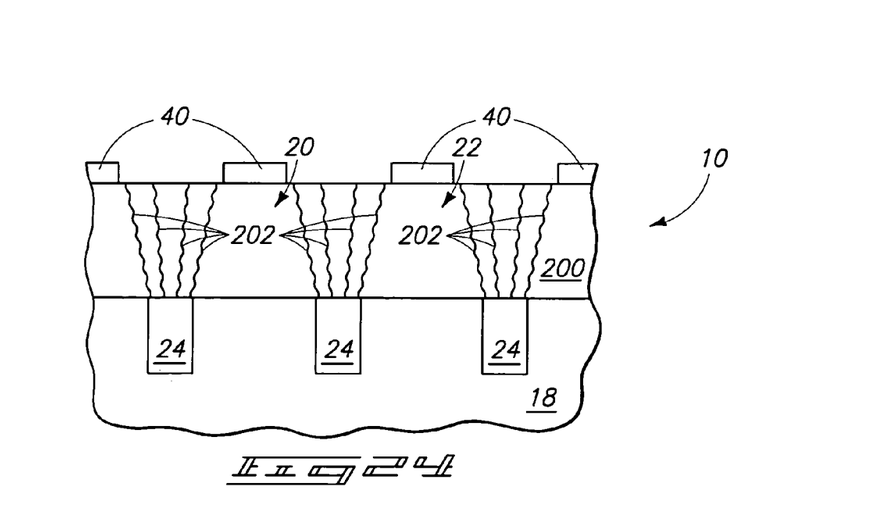
FIG. 24 is a view of the FIG. 23 wafer fragment shown at a processing stage subsequent to that of FIG. 23.
Figure 25:
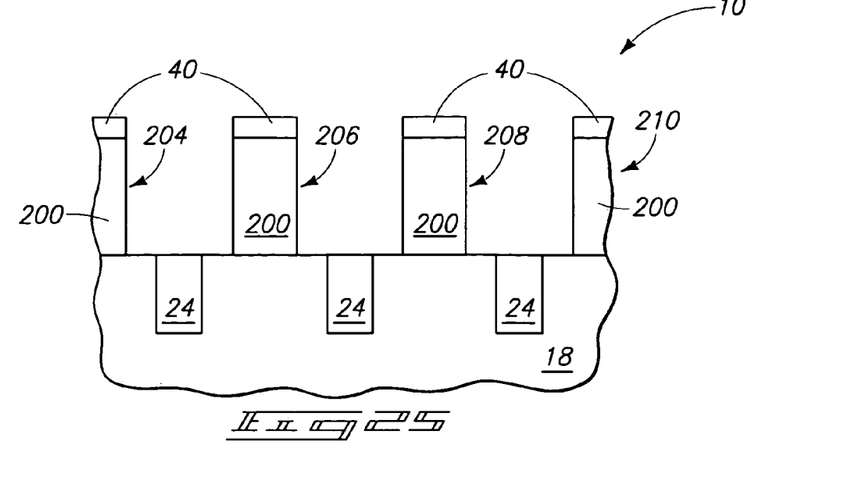
FIG. 25 is a view of the FIG. 23 wafer fragment shown at a processing stage subsequent to that of FIG. 24.

Referring next to FIG. 24, a semiconductor material 200 is epitaxially grown directly over an uppermost surface of monocrystalline material 18. Epitaxially-grown material 200 can, in some aspects, comprise, consist essentially of, or consist of single crystal silicon. The crystalline material 200 comprises defect regions 202 radiating from surfaces of dielectric material 24. The defect regions can be caused by, for example, the epitaxial growth occurring from surfaces of monocrystalline material 18 but not from surfaces of dielectric material 24.

The thickness of material 200 and conditions utilized for growing the material can be adjusted such that the defect regions 202 extend only partially across the regions between dielectric regions 12, 14 and 16 (such as, for example, the regions 20 and 22 described previously). Accordingly, there will be defect-free regions of semiconductor material 200 between dielectric regions 12, 14 and 16. In some aspects, if material 200 is grown to a thickness such that the defect-free regions are undesirably narrow, the material 200 can be planarized back to reduce the lateral thickness of the defective regions and thus increase the lateral width of the defect-free regions. In exemplary aspects, material 200 is grown to a thickness of from about 100 nanometers to about 300 nanometers, and regions 12, 14 and 16 are spaced from one another by about 100 nanometers.

Patterned masking material 40 is formed over the defect-free regions, and subsequently a pattern is transferred from material 40 to underlying semiconductor material 200 to form pillars 204, 206, 208 and 210 (shown in FIG. 25) comprising defect-free regions of material 200. Such pillars can then be utilized in the processing discussed above relative to FIGS. 13-21 to form transistor devices having vertically-extending channel regions.

A notable difference between the processing of FIGS. 23-25 and that of FIGS. 4-9 is that the second semiconductor material (30 of FIGS. 7-9 and 200 of FIG. 24) is formed in the processing of FIGS. 4-9 while an uppermost level of dielectric material 24 is below the uppermost level of semiconductor material 18, and is formed in the processing of FIG. 24 while the uppermost level of dielectric material 24 is coplanar with the uppermost level of material 18.

Another aspect of the invention is described with reference to FIGS. 26 and 27. In referring to FIGS. 26 and 27, similar numbering will be used as was used above in describing FIGS. 1-21, where appropriate.

Figure 26:
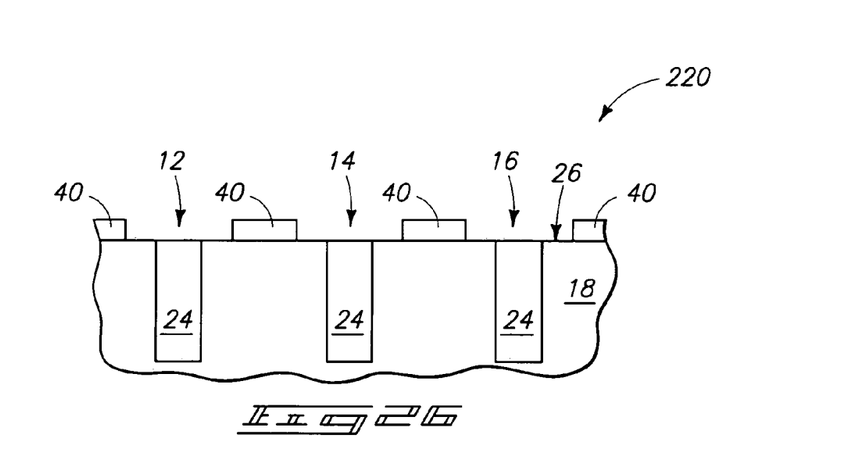
FIG. 26 is a view of the FIG. 2 wafer fragment shown at a processing stage subsequent to that of FIG. 2 in accordance with yet another aspect of the present invention.

Referring initially to FIG. 26, a construction 220 is illustrated at a processing stage subsequent to that of FIG. 2. Construction 220 is similar to the construction 10 described previously, but the isolation regions 12, 14 and 16 of the FIG. 26 construction are much deeper than those of the FIG. 2 construction.

Semiconductor material 18 and dielectric material 24 are shown sharing a coplanar uppermost surface 26. It is to be understood, however, that material 24 can, in some aspects of the invention (not shown) have an upper surface that is above that of semiconductor material 18 at the processing stage of FIG. 26.

Patterned masking material 40 is formed over regions of semiconductor material 18 between regions 12, 14 and 16.

Figure 27:
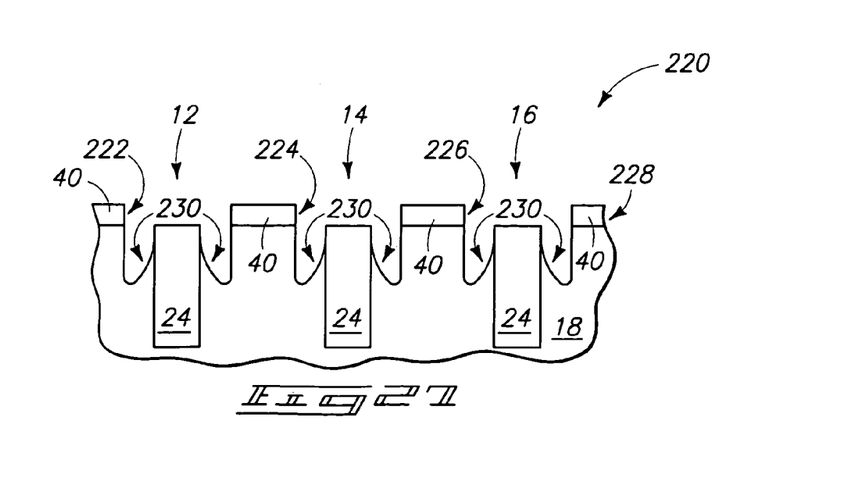
FIG. 27 is a view of the FIG. 26 wafer fragment shown at a processing stage subsequent to that of FIG. 26.

Referring to FIG. 27, pillars are etched into semiconductor material 18 by transferring a pattern from patterned mask 40 into material 18. Such can be accomplished with, for example, a suitable dry etch. The individual pillars are labeled as 222, 224, 226 and 228. The embodiment of FIGS. 26 and 27 can be less preferred than other embodiments described previously in this disclosure, in that the pillars can have the shown stringers 230 extending between the pillars and the dielectric material 24 (the stringers can result from a pro-graded etch or a retrograded etch). In some aspects, such stringers can be removed by appropriate etching. The pillars 222, 224, 226 and 228 can then be subjected to the processing described previously with reference to FIGS. 13-21 to incorporate the pillars into transistor devices comprising vertically-extending channel regions. In some aspects, the dielectric regions 12, 14 and 16 can be left as is so that the dielectric regions have uppermost surfaces approximately coextensive with the uppermost surfaces of the pillars. In other aspects, the dielectric regions can be subjected to suitable processing to reduce the elevational level of the uppermost surfaces of the dielectric regions to beneath those of the pillars.

The pillars of FIG. 27 can be considered to comprise mesas of a first monocrystalline silicon material 18. In the aspect of FIG. 27, the semiconductor material of the pillars is substantially entirely the monocrystalline semiconductor material 18 of the mesas. In other words, the semiconductor material of the pillars consists essentially of, or consists of, the mesas of monocrystalline semiconductor material. This is in contrast to the aspect of FIGS. 1-21 in which the pillars comprise two segments of semiconductor material, with the lowermost segment being the mesa of first semiconductor material and the uppermost segment being a second semiconductor material.

The aspects of the invention described above can have several advantages. For instance, exemplary methodology of the present invention can be incorporated into conventional processes without additional new tooling. Also, exemplary methodology of the present invention can be done with or without epitaxial semiconductor growth. Exemplary aspects of the present invention can be low cost and simple for incorporation into semiconductor fabrication and can reduce, or at least not increase, the number of masking steps relative to conventional processes. Exemplary aspects of the present invention are generally shrinkable for application to future applications with higher levels of integration.

Figure 28:
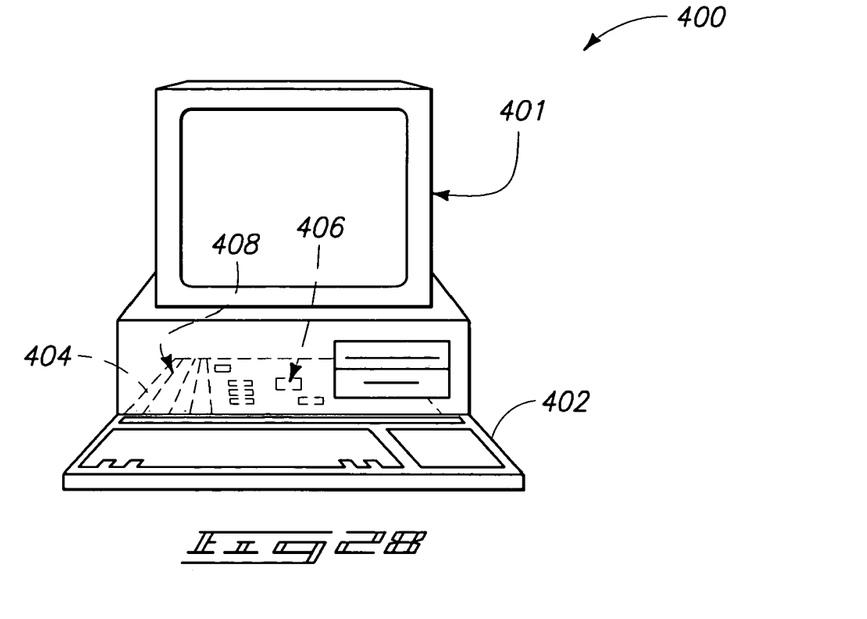
FIG. 28 is a diagrammatic view of a computer illustrating an exemplary application of the present invention.
Figure 29:
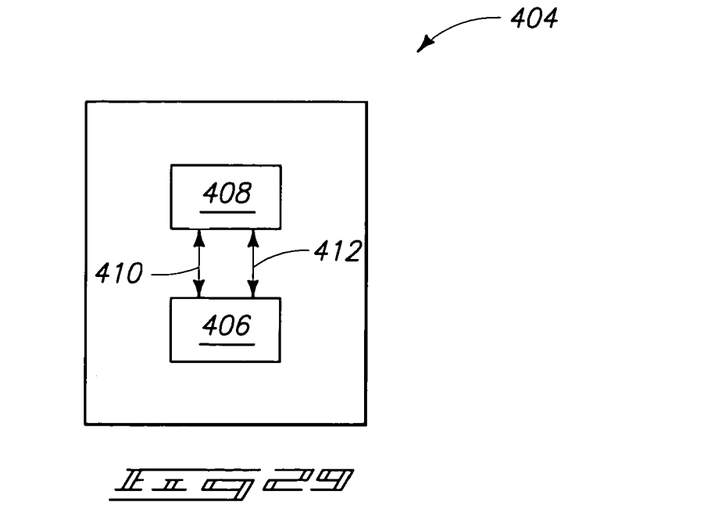
FIG. 29 is a block diagram showing particular features of the motherboard of the FIG. 28 computer.

FIG. 28 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 29. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

FIG. 30 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708.

The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions discussed previously in this disclosure.

FIG. 31 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
   a semiconductor substrate comprising a monocrystalline semiconductor material;
   a plurality of isolation regions within the semiconductor material and extending along a defined longitudinal direction, the isolation regions being spaced from one another by longitudinally-extending strips of the monocrystalline semiconductor material;
   a plurality of lines extending substantially orthogonally to the isolation regions; the lines having dielectric regions over the isolation regions and semiconductor sections between the dielectric regions;
   an array of pillars extending upwardly from the monocrystalline semiconductor material, the array comprising columns along the defined longitudinal direction and rows along a defined horizontal direction which is substantially orthogonal to the defined longitudinal direction; the columns of the array being between the isolation regions and along the longitudinally-extending strips of the monocrystalline semiconductor material, the pillars comprising mesas of the monocrystalline semiconductor material extending upwardly from the longitudinally-extending strips;
   a first set of source/drain regions at upper regions of the pillars;
   a second set of source/drain regions within the sections of the lines;
   a set of channel regions between the first and second sets of source/drain regions; and
   a plurality of gateline rows extending along the defined horizontal direction; the gateline rows extending along the rows of the array of pillars; the gateline rows, channel regions, and first and second sets of source/drain regions forming a plurality of transistor devices; individual transistor devices comprising a first source/drain region of the first set, a second source/drain region of the second set, a channel region extending from the first source/drain region to the second source/drain region, and a gate within the gateline row and proximate the channel region.

2. The construction of claim 1 wherein the pillars consist essentially of the mesas of the monocrystalline semiconductor material.

3. The construction of claim 1 wherein the monocrystalline semiconductor material is a first semiconductor material, and wherein at least some of the individual pillars comprise a segment of second semiconductor material over the mesa of the monocrystalline semiconductor material.

4. The construction of claim 3 wherein the semiconductor sections are of the second semiconductor material.

5. The construction of claim 3 wherein the second semiconductor material is a monocrystalline semiconductor material.

6. The construction of claim 3 wherein the second semiconductor material is a polycrystalline or amorphous semiconductor material.

7. The construction of claim 1 wherein horizontally adjacent pillars are longitudinally staggered relative to one another.

8. The construction of claim 1 wherein horizontally adjacent pillars are substantially not longitudinally staggered relative to one another.

9. The construction of claim 1 further comprising:
- a capacitor in electrical connection with the second source/drain region of a transistor device; and
- a bitline in electrical connection with the first source/drain region of the transistor device.

10. An electronic device comprising the construction of claim 9.

* * * * *